(12) United States Patent
Uesaka (10) Patent No.: US 10,559,616 B2
(45) Date of Patent: Feb. 11, 2020

(54) SOLID-STATE IMAGING APPARATUS AND ELECTRONIC DEVICE

(71) Applicant: SONY SEMICONDUCTOR SOLUTIONS CORPORATION, Kanagawa (JP)

(72) Inventor: Yusuke Uesaka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/746,558

(22) PCT Filed: Jul. 15, 2016

(86) PCT No.: PCT/JP2016/071055
§ 371 (c)(1),
(2) Date: Jan. 22, 2018

(87) PCT Pub. No.: WO2017/018258
PCT Pub. Date: Feb. 2, 2017

(65) Prior Publication Data
US 2019/0006407 A1    Jan. 3, 2019

(30) Foreign Application Priority Data

Jul. 30, 2015  (JP) ................................ 2015-150329

(51) Int. Cl.
*H01L 27/146*    (2006.01)
*H04N 5/361*     (2011.01)
(Continued)

(52) U.S. Cl.
CPC .... *H01L 27/14625* (2013.01); *H01L 27/1464* (2013.01); *H01L 27/14621* (2013.01);
(Continued)

(58) Field of Classification Search
None
See application file for complete search history.

(56) References Cited

U.S. PATENT DOCUMENTS

2005/0045928 A1* 3/2005 Kuriyama ........... H01L 27/1463
257/294
2012/0287297 A1* 11/2012 Fukuda ................ G02B 5/3058
348/222.1
(Continued)

FOREIGN PATENT DOCUMENTS

| JP | 2010-263021 | 11/2010 |
| JP | 2012-080065 | 4/2012 |
| JP | 2014-192348 | 10/2014 |

OTHER PUBLICATIONS

International Search Report prepared by the Japan Patent Office dated Sep. 7, 2016, for International Application No. PCT/JP2016/071055.

*Primary Examiner* — Anthony Ho
*Assistant Examiner* — Kevin Quinto
(74) *Attorney, Agent, or Firm* — Sheridan Ross P.C.

(57) ABSTRACT

The present technology relates to a solid-state imaging apparatus and an electronic device that are configured to enhance the accuracy in the detection of polarization information. The solid-state imaging apparatus has a pixel array block on which pixels each including a photoelectric conversion device are arranged; a polarizer, including a conductive light-shielding material, that covers a photosensitive surface of the above-mentioned photoelectric conversion device of at least part of the above-mentioned pixels; a light-shielding film, including a conductive light-shielding material, that is arranged between the above-mentioned adjacent pixels on the photosensitive surface side of the above-mentioned photoelectric conversion device; and a wiring layer arranged on a side opposite to the photosensi-
(Continued)

tive surface of the above-mentioned photoelectric conversion device, in which the above-mentioned polarizer is connected to a wiring of the above-mentioned wiring layer via the above-mentioned light-shielding film. The present technology is applicable to solid-state imaging apparatuses, for example.

7 Claims, 9 Drawing Sheets

(51) Int. Cl.
  *G02B 5/30* (2006.01)
  *H04N 5/341* (2011.01)
  *H04N 5/376* (2011.01)
  *H04N 5/378* (2011.01)

(52) U.S. Cl.
  CPC .. *H01L 27/14623* (2013.01); *H01L 27/14627* (2013.01); *H01L 27/14636* (2013.01); *H01L 27/14645* (2013.01); *H04N 5/361* (2013.01); *G02B 5/3058* (2013.01); *H04N 5/341* (2013.01); *H04N 5/378* (2013.01); *H04N 5/3765* (2013.01)

(56) References Cited

U.S. PATENT DOCUMENTS

2012/0319222 A1  12/2012  Ozawa et al.
2014/0291793 A1  10/2014  Tanaka

\* cited by examiner

SOLID-STATE IMAGING APPARATUS AND ELECTRONIC DEVICE

CROSS REFERENCE TO RELATED APPLICATIONS

This application is a national stage application under 35 U.S.C. 371 and claims the benefit of PCT Application No. PCT/JP2016/071055 having an international filing date of 15 Jul. 2016, which designated the United States, which PCT application claimed the benefit of Japan Patent Application No. 2015-150329 filed 30 Jul. 2015, the disclosures of each of which are incorporated herein by reference.

TECHNICAL FIELD

The present technology relates to a solid-state imaging apparatus and an electronic device and, more particularly, to a solid-state imaging apparatus and an electronic device that are configured to enhance the detection accuracy of polarization information.

BACKGROUND ART

In the past, the detection of polarization information has been proposed in a solid-state imaging apparatus in which polarization pixels having a polarizer are arranged at a predetermined interval (refer to PTL 1 below, for example).

CITATION LIST

Patent Literature

[PTL 1]
  JP 2010-263158A

SUMMARY

Technical Problem

However, since a polarization pixel is restricted in the light entered by a polarizer into a photoelectric conversion device, a polarization pixel is lower in sensitivity than a pixel having no polarizer. Therefore, especially in dark places in which enough sensitivity cannot be obtained, the ratio of the noise component of a polarization pixel increases, thereby resulting in a greater error in the polarization information detected by the polarization pixel.

Therefore, the present technology is to enhance the detection accuracy of polarization information.

Solution to Problem

A solid-state apparatus according to a first aspect of the present technology has a pixel array block on which pixels each including a photoelectric conversion device are arranged; a polarizer that includes a conductive light-shielding material and covers a photosensitive surface of the above-mentioned photoelectric conversion device of at least part of the above-mentioned pixels; a light-shielding film that includes a conductive light-shielding material and is arranged between the above-mentioned adjacent pixels on the photosensitive surface side of the above-mentioned photoelectric conversion device; and a wiring layer arranged on a side opposite to the photosensitive surface of the above-mentioned photoelectric conversion device. In this configuration, the above-mentioned polarizer is connected to a wiring of the above-mentioned wiring layer via the above-mentioned light-shielding film.

A negative potential may be applied to the above-mentioned polarizer via the above-mentioned wiring and the above-mentioned light-shielding film.

The above-mentioned light-shielding film and the above-mentioned wiring may be interconnected with a through-hole electrode penetrating a semiconductor substrate on which the above-mentioned photoelectric conversion device is formed.

The above-mentioned through-hole electrode may include a conductive light-shielding material and enclose a side surface of the above-mentioned photoelectric conversion device.

The above-mentioned through-hole electrode may be formed in an area around the above-mentioned pixel array block.

The above-mentioned polarizer and the above-mentioned light-shielding film may be formed on a same layer.

An electronic device according to a second aspect of the present technology has a solid-state imaging apparatus and a signal processing block configured to process a signal outputted from the above-mentioned solid-state imaging apparatus. The above-mentioned solid-state imaging apparatus has a pixel array block on which pixels each including a photoelectric conversion device are arranged; a polarizer that includes a conductive light-shielding material and covers a photosensitive surface of the above-mentioned photoelectric conversion device of at least part of the above-mentioned pixels; a light-shielding film that includes a conductive light-shielding material and is arranged between the above-mentioned adjacent pixels on the photosensitive surface side of the above-mentioned photoelectric conversion device; and a wiring layer arranged on a side opposite to the photosensitive surface of the above-mentioned photoelectric conversion device. In this configuration, the above-mentioned polarizer is connected to a wiring of the above-mentioned wiring layer via the above-mentioned light-shielding film.

In the first aspect or second aspect of the present technology, the polarizer is connected to the wiring of the wiring layer via the light-shielding film.

Advantageous Effects of Invention

According to the first aspect or the second aspect of the present technology, the accuracy in the detection of polarization information is enhanced.

It should be noted that the advantageous effects described above are not always restrictive; namely, any one of the advantageous effects described herein may be regarded as an advantageous effect.

DESCRIPTION OF EMBODIMENTS

The following describes, in detail, modes of practicing the invention (hereafter referred to as "embodiments") with reference to attached drawings. It should be noted that the description will be done in the following sequence:

1. Solid-state imaging apparatus to which present technology is applied;
2. First embodiment (example in which, of backside illumination type, polarization pixel and color pixel are same in size);
3. Second embodiment (example in which, of backside illumination type, polarization pixel and color pixel are different);
4. Variations; and
5. Usage examples of solid-state imaging apparatus.

1. Solid-State Imaging Apparatus to which Present Technology is Applied

{Basic System Configuration}

Figure 1:
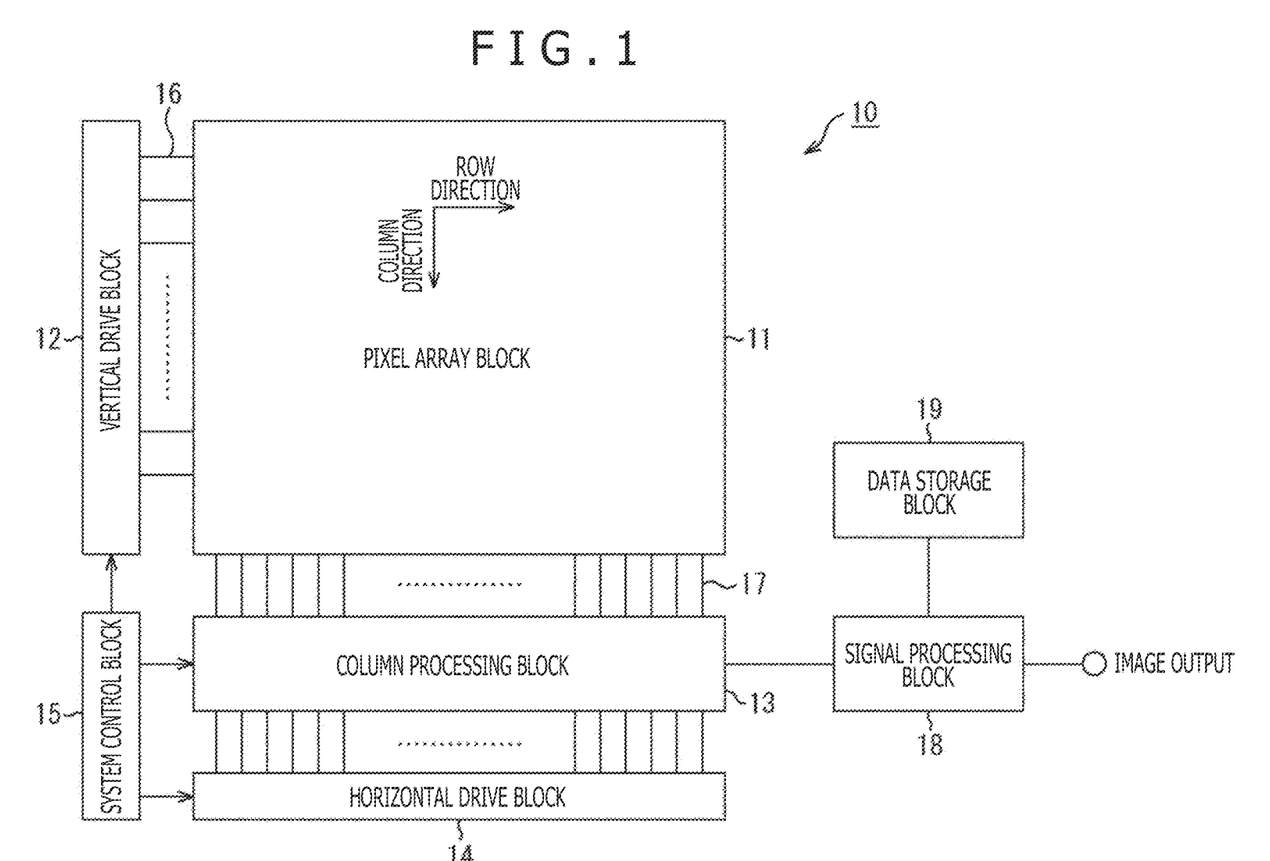
FIG. 1 is a system configuration diagram illustrating an outline of a configuration of a CMOS image sensor to which the present technology is applied.

FIG. 1 depicts a system configuration diagram illustrating an outline of a configuration of a solid-state imaging apparatus to which the present technology is applied; for example, a CMOS image sensor that is one type of an X-Y addressing solid-state imaging apparatus. A CMOS image sensor herein denotes an image sensor created by applying or partially using a CMOS process.

A CMOS image sensor 10 associated with the present application example has a pixel array block 11 formed on a semiconductor substrate (a chip) not depicted and a peripheral circuit block integrated on the same semiconductor substrate on which the pixel array block 11 is formed. The peripheral circuit block has a vertical drive block 12, a column processing block 13, a horizontal drive block 14, and a system control block 15, for example.

The CMOS image sensor 10 further has a signal processing block 18 and a data storage block 19. The signal processing block 18 and the data storage block 19 may be installed on the same substrate where the CMOS image sensor 10 is formed or may be disposed on a substrate separate from the substrate on which the CMOS image sensor 10 is formed. Further, the respective processing operations that are executed by the signal processing block 18 and the data storage block 19 may be the processing operations that are executed by an external signal processing block arranged on a substrate separate from the substrate on which the CMOS image sensor 10 is formed; for example, the processing operations that are executed by a DSP (Digital Signal Processor) circuit or software.

The pixel array block 11 has a configuration in which two or more unit pixels (hereafter sometimes simply referred to as "pixels") are arranged in a row direction and a column direction. Here, the row direction denotes a direction in which the pixels of a pixel row are arranged (namely, a horizontal direction) and the column direction denotes a direction in which the pixels of a pixel column are arranged (namely, a vertical direction).

A unit pixel has a photoelectric conversion block (a photo diode, for example) for generating and accumulating charges in accordance with the intensity of a received light and two or more pixel transistors (so-called MOS transistors). The two or more pixel transistors may include three transistors: a transfer transistor; a reset transistor; and an amplification transistor, for example. Alternatively, the two or more pixel transistors may include four transistors with a selection transistor added to the above-mentioned three transistors. Note that, since an equivalent circuit of each pixel is similar to a generally available one, the detail description thereof is skipped.

Further, a unit pixel may be of a sharing pixel structure. The sharing pixel structure is configured by two or more photoelectric conversion devices, two or more transfer transistors, one shared floating diffusion, and another shared pixel transistor.

In the pixel array block 11, a pixel drive line 16 as a row signal line is wired along the row direction for each pixel row and a vertical signal line 17 as a column signal line is wired along the column direction for each pixel column. The pixel drive line 16 transmits a drive signal for driving the reading of a signal from a pixel. In FIG. 1, a pixel drive line 16 as one wiring is depicted; however, the number is not limited to one. One end of the pixel drive line 16 is connected to an output terminal corresponding to each row of the vertical drive block 12.

The vertical drive block 12 includes a shift register and an address decoder and drives each pixel of the pixel array block 11 all at the same time or in units of rows. That is, the vertical drive block 12 configures a drive block for controlling an operation of each pixel of the pixel array block 11 along with the system control block 15 for controlling this vertical drive block 12. Illustration of a specific configuration of this vertical drive block 12 is skipped; generally, however, the vertical drive block 12 has a configuration having two scan systems, a read scan system and a sweep scan system.

The read scan system sequentially and selectively scans the unit pixels of the pixel array block 11 on a unit basis in order to read a signal from the unit pixel. The signal read from a unit pixel is an analog signal. The sweep scan system executes a sweep scan earlier than a read scan by an exposure time on a read row to be read-scanned by the read scan system.

A sweep scan by this sweep scan system sweeps the unnecessary charges from the photoelectric conversion block of the unit pixels of a read row, thereby resetting the photoelectric conversion block concerned. Then, the sweeping (the resetting) of the unnecessary charges by this sweep scan system causes a so-called electronic shutter operation. Here, the electronic shutter operation denotes an operation in which the charges in the photoelectric conversion block are discarded so as to start a new exposure (start accumulating charges).

A signal read by a read operation done by the read scan system corresponds to the intensity of light received after an immediately preceding read operation or an electronic shutter operation. Then, an interval from a timing of reading by the immediately preceding read operation or a timing of a sweep done by an electronic shutter operation to a timing of reading by a read operation done this time becomes a charge exposure interval in the unit pixel.

A signal outputted from each unit pixel of each pixel row selectively scanned by the vertical drive block 12 is entered in the column processing block 13 through the vertical signal line 17 for each pixel row. The column processing block 13 executes predetermined signal processing on the signal outputted from each pixel of the selected row through the vertical signal line 17 for each pixel column of the pixel array block 11 and, at the same time, temporarily retains the pixel signal on which signal processing has been executed.

To be more specific, for the signal processing, the column processing block 13 at least executes noise cancellation processing; CDS (Correlated Double Sampling) processing, for example, or DDS (Double Data Sampling) processing, for example. The CDS processing cancels a reset noise and a fixed pattern noise unique to pixel such as a fluctuation of threshold values of the amplification transistors in a pixel. It is also practicable to provide the column processing block 13 with an AD (Analog to Digital) conversion function, for example, in addition to the noise cancellation processing function so as to convert an analog pixel signal to a digital signal to output this digital signal.

The horizontal drive block 14 includes a shift register and an address decoder and sequentially selects unit circuits corresponding to the pixel rows of the column processing block 13. The selective scan operation by this horizontal drive block 14 sequentially outputs pixel signals signal-processed for each unit circuit in the column processing block 13.

The system control block 15 includes a timing generator for generating various types of timing signals and other components and executes drive control of the vertical drive block 12, the column processing block 13, and the horizontal drive block 14 on the basis of various timings generated by this timing generator.

The signal processing block 18 at least has a computation processing function so as to execute various signal processing operations such as computation processing on a pixel signal outputted from the column processing block 13. In the signal processing in the signal processing block 18, the data storage block 19 temporarily stores data necessary for this signal processing.

2. First Embodiment

The following describes, with reference to FIG. 2 through FIG. 5, a CMOS image sensor 10A that is the first embodiment of the CMOS image sensor 10 depicted in FIG. 1.
{Exemplary Configuration of CMOS Image Sensor 10A}

Figure 2:
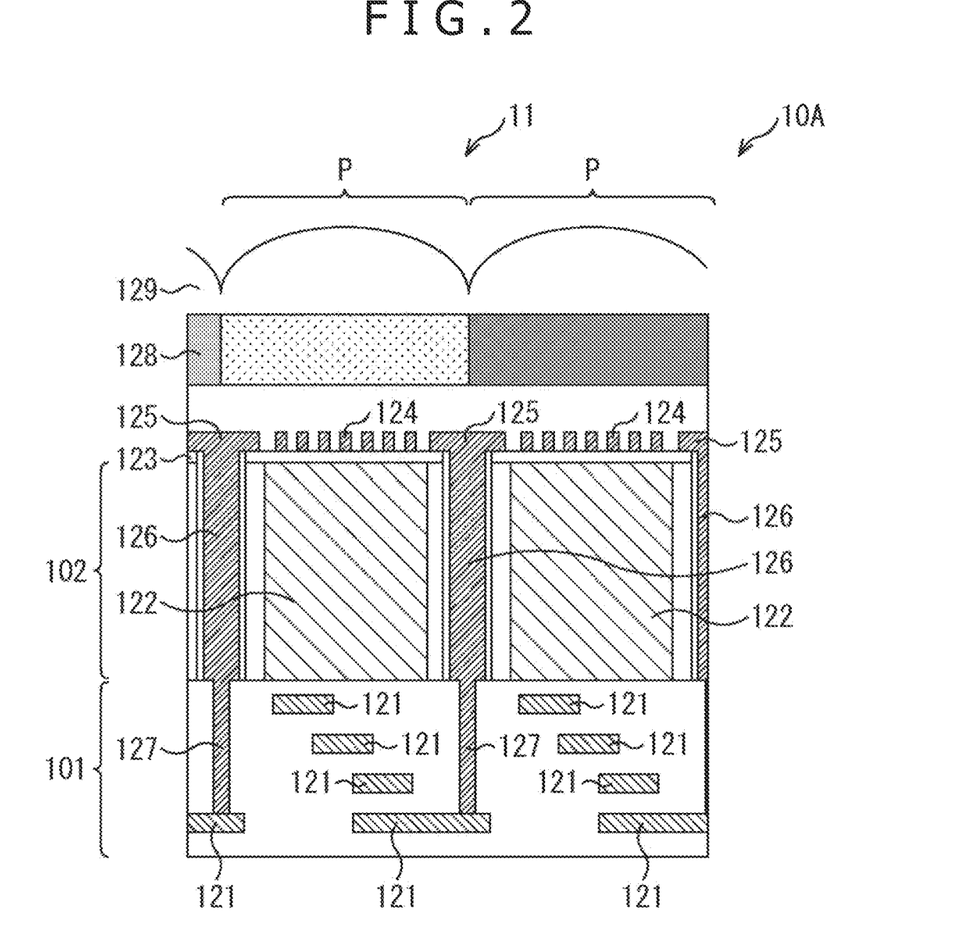
FIG. 2 is a cross-sectional view schematically illustrating a first embodiment of the CMOS image sensor.

FIG. 2 depicts a cross-sectional diagram schematically illustrating a configuration of part of the pixel array block 11 of the CMOS image sensor 10A. It should be noted that this diagram illustrates a cross section of a part including two pixels P; however, other pixels P have basically the same configuration as that of the above-mentioned two pixels P.

It should be noted that, in what follows, the light incident side (the upper part of FIG. 2) is assumed to be the top of the CMOS image sensor 10A and the side opposite to the light incident side (the lower part of FIG. 2) is assumed to be the bottom of the CMOS image sensor 10A.

The CMOS image sensor 10A has a structure of so-called rear-side illumination type in which light incidence occurs from the rear side that is opposite to the surface side laminated with a wiring layer 101 of a semiconductor substrate 102. It should be noted that the rear side of the semiconductor substrate 102 is hereinafter referred to as a light incidence surface or a photosensitive surface.

The wiring layer 101 has two or more layers of wirings 121 laminated.

The semiconductor substrate 102 includes a photoelectric conversion device 122 inside an area of each pixel P. The photoelectric conversion device 122 includes a photo diode, for example.

On the incidence surface of the semiconductor substrate 102, a polarizer 124 and a light-shielding film 125 are formed in the same layer via an oxide film 123. Forming the polarizer 124 and the light-shielding film 125 on the same layer allows the lowering of the upper layer of the photoelectric conversion device 122, thereby realizing the enhancement of sensitivity.

The polarizer 124 is arranged so as to cover the incidence surface of the photoelectric conversion device 122 of each pixel P. The polarizer 124 includes a wire grid polarizer, for example, which includes two or more electrically conductive light-shielding material strips and slits arranged therebetween. The polarizer 124 transmits a polarized wave having the electric field component in the direction orthogonal to the direction in which the electrically conductive light-shielding material strips extend and blocks the transmission of a polarized wave having the electric field component parallel to the direction in which the electrically conductive light-shielding material strips extend. The electrically conductive light-shielding material of the polarizer 124 uses a material that is small in complex refractive index in a wavelength region in which the photoelectric conversion device 122 has sensitivity, for example. Such a material includes aluminum, copper, gold, silver, platinum, tungsten or an alloy thereof, for example.

The light-shielding film 125 includes an electrically conductive light-shielding material as with the polarizer 124. The light-shielding film 125 encloses the periphery of the polarizer 124 on the photosensitive surface side of the photoelectric conversion device 122 and is arranged so as to fill the gaps between adjacent pixels P in the state of a lattice.

A through-hole electrode 126 includes an electrically conductive light-shielding material as with the polarizer 124 and the light-shielding film 125. The through-hole electrode 126 extends down from the light-shielding film 125, penetrates the semiconductor substrate 102, and is formed so as to enclose the side surface of each photoelectric conversion device 122, thereby also functioning as a filled light-shielding film.

A contact 127 is a via formed on the wiring layer 101, for example, thereby interconnecting the through-hole electrode 126 and the wiring 121. It should be noted that, in this example, the contact 127 is connected to the wiring 121 of the lowest layer of the wiring layer 101; however, it is also practicable to connect the contact 127 to the wiring 121 of another layer.

The top of the layer including the polarizer 124 and the light-shielding film 125 is laminated with a color filter 128 and an on-chip micro lens 129 via a flattening film or the like. The color filter 128 includes an R filter for transmitting the light of red wavelength band, a G filter for transmitting the light of green wavelength band, and a B filter for transmitting the light of blue wavelength band, for example.

The light entered in the on-chip micro lens 129 is condensed so as to enter the color filter 128 of each pixel P, the light of a predetermined wavelength band being filtered by the color filter 128. At the same time, of pieces of the light filtered by the color filter 128, the light in a predetermined polarization direction passes the polarizer 124, entering the photoelectric conversion device 122. Then, photoelectric conversion is executed by the photoelectric conversion device 122 and a resultant analog electrical signal based on the charge generated by the photoelectric conversion is outputted to the column processing block 13 via the vertical signal line 17. Thus, polarization information and color information are detected in each pixel P.

Here, the polarizer 124 of each pixel P is regularly applied with a negative bias voltage from a power supply not depicted via the light-shielding film 125, the through-hole electrode 126, the contact 127, and the wiring 121, thereby providing a negative potential. Consequently, the pinning performance of the surface section (the photosensitive surface) of the photoelectric conversion device 122 is strengthened, thereby suppressing the occurrence of a dark-time noise (a dark current). As a result, the accuracy of detecting the polarization information and color information of each pixel P is enhanced. Especially, even in dark places where necessary sensitivity cannot be obtained, the increase in a noise component ratio of each pixel P can be held down, leading to the enhancement in the accuracy of detecting the polarization information and the color information.

In addition, a negative fixed charge film layer need not be arranged on the surface of the photoelectric conversion device 122 for dark-current suppression, thereby realizing cost saving, for example.

Further, the film thickness of the oxide film 123 can be made thinner and the layer above the photoelectric conversion device 122 can be made lower, thereby enhancing the sensitivity, for example.

Still further, by the light-shielding film 125 and the through-hole electrode 126, the light incidence in a diagonal direction from adjacent pixels P can be suppressed, thereby preventing the occurrence of color mixture.

{Example of Arrangement of Polarizer 124 and Contact 127}

FIG. 3 through FIG. 9 schematically depict diagrams illustrating the angles of the transmission axis and the positions of the contact 127 of the polarizer 124 of the CMOS image sensor 10A. To be more specific, in FIG. 3 through FIG. 9, the angles of the transmission axis of the polarizer 124 arranged on the pixels Pa through Pd are indicated by straight lines and the positions of the contact 127 are indicated by white hexagons. It should be noted that the angle of the transmission axis of the polarizer 124 is hereinafter also referred to as a polarization angle.

FIG. 3 through FIG. 9 depict blocks including two rows× two columns of pixels Pa through Pd that have polarizers 124 having polarization angles that are different by 45 degrees each. Let the polarization angle of each polarizer 124 be rotated clockwise starting from the column direction (0 degrees) that is the vertical direction in the diagram, then the polarization angles of the polarizers 124 of the pixels Pa through Pd are each 0 degrees, 45 degrees, 90 degrees, and 135 degrees so that each polarizer 124 transmits the light that is parallel to the transmission axis. Then, in the pixel array block 11, the block including the pixels Pa through Pd is cyclically arranged in the state of a lattice (in a matrix) in the row direction and the column direction.

Figure 3:
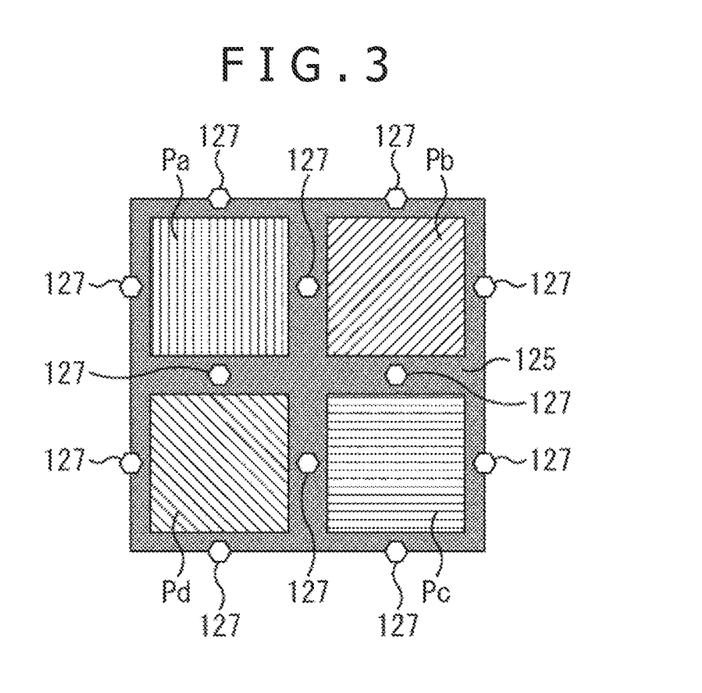
FIG. 3 is a schematic diagram illustrating a first example of an angle of transmission axis of a polarizer and a position of a contactor.

Then, in the example depicted in FIG. 3, the contacts 127 are arranged between the pixels P. That is, in the pixels P adjacent to each other in the row direction, the contact 127 is arranged at the approximate center of the side in the row direction of each pixel P. In addition, in the pixels P adjacent to each other in the column direction, the contact 127 is arranged at the approximate center of the side in the column direction of each pixel P.

It should be noted that if a negative bias voltage can be sufficiently applied to the polarizer 124 of each pixel P, then, as depicted in FIG. 4 through FIG. 9, for example, no contact 127 need be arranged between all pixels P.

Figure 4:
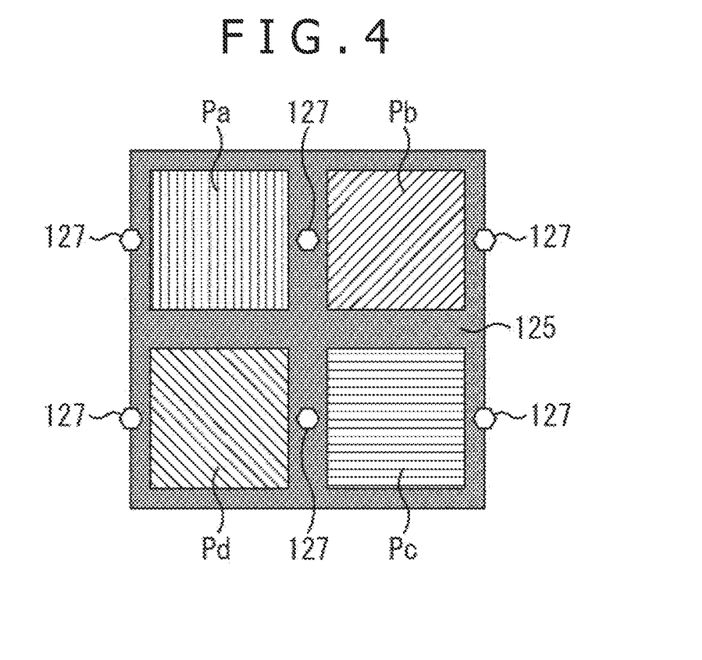
FIG. 4 is a schematic diagram illustrating a second example of an angle of transmission axis of a polarizer and a position of a contactor.

For example, FIG. 4 depicts an example in which the contacts 127 arranged between the pixels P adjacent to each other in the column direction are omitted from the example depicted in FIG. 3. That is, in this example, the contacts 127 are arranged between the pixels P adjacent to each other in the row direction and no contact 127 is arranged between the pixels P adjacent to each other in the column direction.

Figure 5:
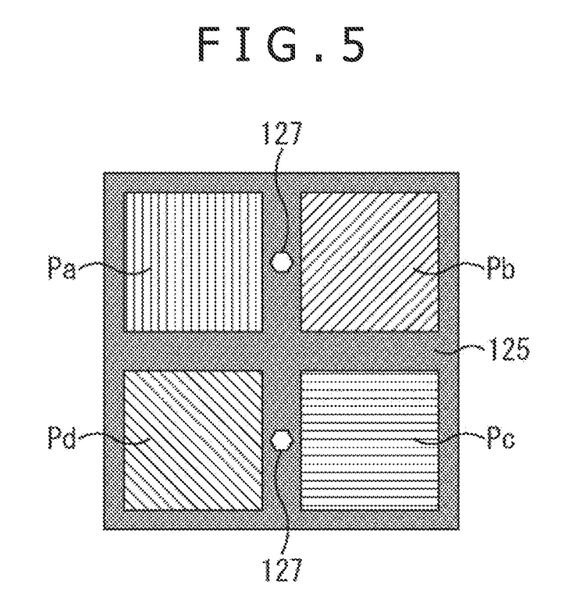
FIG. 5 is a schematic diagram illustrating a third example of an angle of transmission axis of a polarizer and a position of a contactor.

FIG. 5 depicts an example in which the contacts 127 are omitted every other columns from the example depicted in FIG. 4. That is, in this example, the contacts 127 are arranged between the pixels P adjacent to each other in the row direction in every other column.

Figure 6:
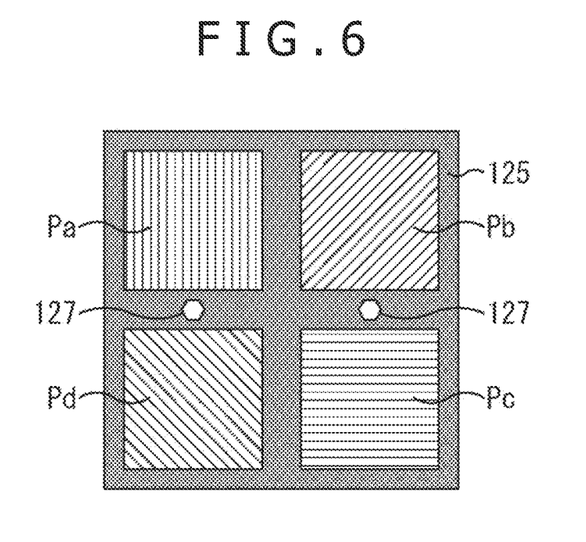
FIG. 6 is a schematic diagram illustrating a fourth example of an angle of transmission axis of a polarizer and a position of a contactor.

In the example depicted in FIG. 6, the contacts 127 are arranged between the pixels P adjacent to each other in the column direction in every other row as conversely from the example depicted in FIG. 5.

Figure 7:
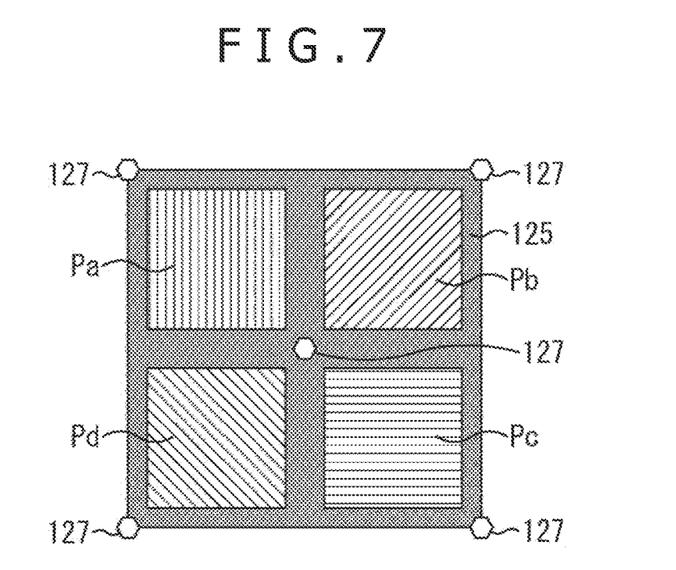
FIG. 7 is a schematic diagram illustrating a fifth example of an angle of transmission axis of a polarizer and a position of a contactor.

In the example depicted in FIG. 7, the contacts 127 are arranged between the four pixels P adjacent to each other in the row direction and the column direction. To be more specific, in this example, if the pixel array block 11 is divided into blocks each including two rows×two columns of pixels P, then the contacts 127 are arranged at the four corners and the center of each block.

Figure 8:
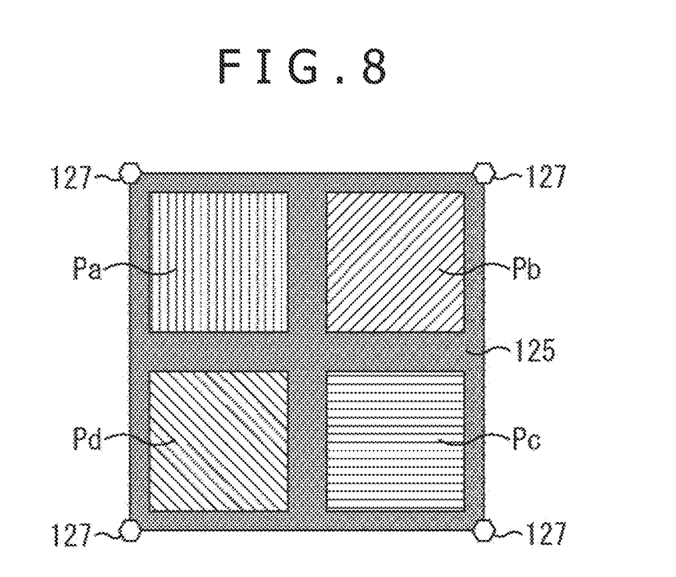
FIG. 8 is a schematic diagram illustrating a sixth example of an angle of transmission axis of a polarizer and a position of a contactor.

FIG. 8 depicts an example in which the contact 127 arranged at the center of the block is omitted from the example depicted in FIG. 7. That is, in this example, if the pixel array block 11 is divided into blocks each including two rows×two columns of pixels P, then the contacts 127 are arranged at the four corners of each block.

Figure 9:
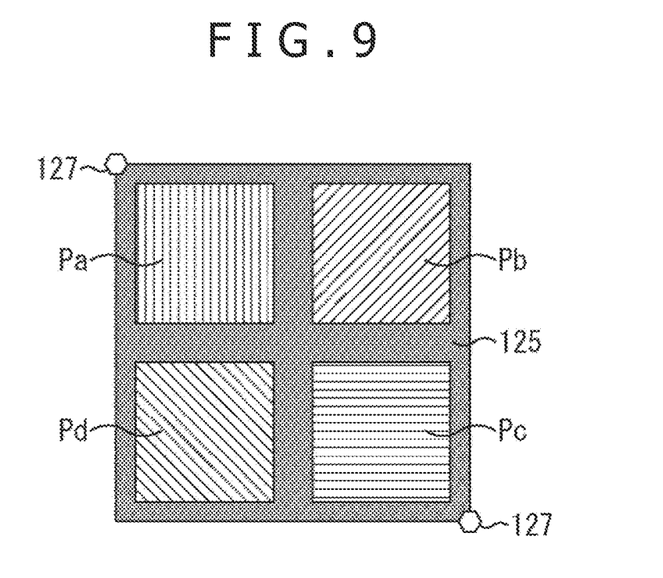
FIG. 9 is a schematic diagram illustrating a seventh example of an angle of transmission axis of a polarizer and a position of a contactor.

FIG. 9 depicts an example in which the contacts 127 arranged at the upper right corner and the lower left corner of the block are omitted from the example depicted in FIG. 8. It should be noted that, in this example, if the pixel array block 11 is divided into blocks each including four rows× four columns of pixels P, the contacts 127 are arranged at the four corners and the center of each block.

It should be noted that, in the color filter 128, filters of different colors or the same color may be arranged to the pixels Pa through Pd. For example, in the former case, the R filter may be arranged to the pixel Pa, the G filter may be arranged to the pixels Pb and Pd, and the B filter may be arranged to the pixel Pc in accordance with Bayer array, for example. In the latter case, the filters of the same color may be arranged to the pixels Pa through Pd and the filter color may follow Bayer array in unit of a block including the pixels Pa through Pd, for example.

3. Second Embodiment

Figure 10:
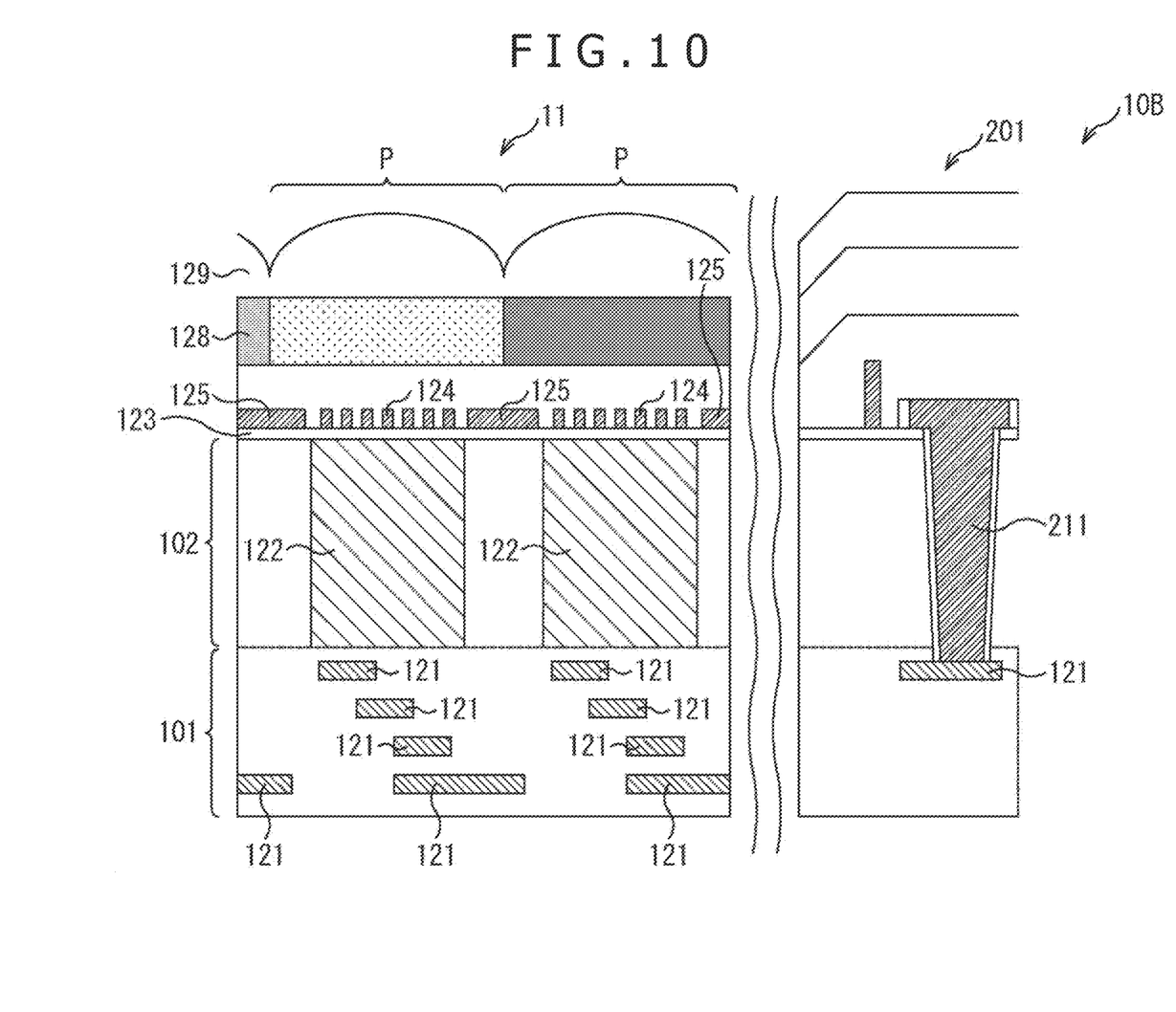
FIG. 10 is a cross-sectional view schematically illustrating a second embodiment of the CMOS image sensor.

The following describes a CMOS image sensor 10B practiced as the second embodiment of the CMOS image sensor 10 depicted in FIG. 1 with reference to FIG. 10.

{Exemplary Configuration of CMOS Image Sensor 10B}

FIG. 10 depicts a cross-sectional diagram schematically illustrating an exemplary configuration of parts of the pixel array block 11 of the CMOS image sensor 10B and a peripheral section 201 which is an area enclosing the peripheries of the pixel array block 11. It should be noted that this diagram depicts the cross section of a part that includes two pixels P; however, other pixels P have basically the same configuration. Further, in the diagram, the parts corresponding to those depicted in FIG. 2 are identified with the same reference numbers.

The CMOS image sensor 10B is different from the CMOS image sensor 10A depicted in FIG. 2 in that a through-hole electrode 211 is arranged on the peripheral section 201 and the through-hole electrode 126 and the contact 127 are not arranged on the pixel array block 11.

To be more specific, the through-hole electrode 211 is formed so as to penetrate the semiconductor substrate 102 in the peripheral section 201 and, at the same time, connected to the wiring 121 of the wiring layer 101. Further, the through-hole electrode 211 is, for example, connected to the light-shielding film 125 in the pixel array block 11 via a wiring not depicted. Alternatively, a part of the light-shielding film 125 may be extended to the outside of the pixel array block 11 so as to make the light-shielding film 125 and the through-hole electrode 211 contact with each other.

Then, the polarizer 124 of each pixel P is regularly applied with a negative bias voltage from a power supply not depicted via the light-shielding film 125, the through-hole electrode 211, and the wiring 121, thereby providing a negative potential. Consequently, the pinning performance of the surface section (the photosensitive surface) of the photoelectric conversion device 122 is strengthened, thereby suppressing the occurrence of a dark-time noise (a dark current) as with the CMOS image sensor 10A.

4. Variations

The following describes variations of the embodiment of the present technology described above.

{Variation Related with Through-Hole Electrode 126}

For example, it is also practicable not to use the through-hole electrode 126 of the CMOS image sensor 10A as a light-shielding film. In this case, it is practicable to form the through-hole electrode 126 with a material that is low in light-shielding property. Further, in this case, it is not always necessary to enclose the side surface of each photoelectric conversion device 122 with the through-hole electrode 126; for example, it is practicable to make the through-hole electrode 126 a thin pillar extending up and down directions.

Even in the case where the through-hole electrode 126 is used as a light-shielding film, the through-hole electrode 126 need not always enclose all the side surfaces of the photoelectric conversion device 122; it is also practicable for the through-hole electrode 126 to partially enclose the side surface of the photoelectric conversion device 122.

Further, it is also practicable to interconnect the light-shielding film 125 and the wiring 121 by other means than through-hole electrodes, without arranging through-hole electrodes. In this case, for example, a negative bias may be given to the light-shielding film 125 from an external power supply not through the wiring 121.

{Variation Related with Polarizer 124}

If a polarizer having a structure other than a wire grid has conductivity, such a polarizer may be used as the polarizer 124.

Further, if the polarizer 124 and the light-shielding film 125 are electrically interconnected, the polarizer 124 and the light-shielding film 125 may be formed on different layers.

Further, it is also practicable to arrange the polarizer 124 only on some pixels P and arrange a pixel P that detects only color information without using the polarizer 124.

In the above description, the polarization angles (the angles of the transmission axis of the polarizer 124) of the polarizer 124 are four types including 0 degrees, 45 degrees, 90 degrees, and 135 degrees by way of example; however, it is also practicable to change the combinations of the polarization angles and the number thereof as desired. For example, the polarization angles of the polarizer 124 may be of 180/8 types different by 8 degree and the polarizers 124 of 180/8 types may be regularly arranged.

{Variation Related with Color Filter 128}

The type and arrangement of the color filter 128 may be set as desired. For example, the number of colors of the color filter 128 may also be set to four types including R, G, B, and W (transparent); three types including M (Magenta), Y (Yellow), and C (Cyan); or four types including M, Y, C, and W.

Further, if the polarizer 124 is arranged on only some pixels P, a W filter may be arranged on the pixel P on which the polarizer 124 is arranged and color filters may be arranged on the other pixels P.

Still further, for example, it is also practicable to use an organic photoelectric conversion film so as to detect color information, thereby removing the color filter 128.

{Other Variations}

In the embodiment described above, the case in which the present technology is applied to a CMOS image sensor with unit pixels arranged in a matrix manner was illustrated as an example; however, the present technology is not restricted to the application to CMOS image sensors. That is, the present technology is applicable to all solid-state imaging apparatuses of X-Y addressing with unit pixels two-dimensionally arranged in a matrix manner.

It should be noted that a solid-state imaging apparatus may be formed on a single chip or may be of a module form having an imaging performance with a signal processing block or an optical system being collectively packaged.

5. Usage Examples of Solid-State Imaging Apparatus

Figure 11:
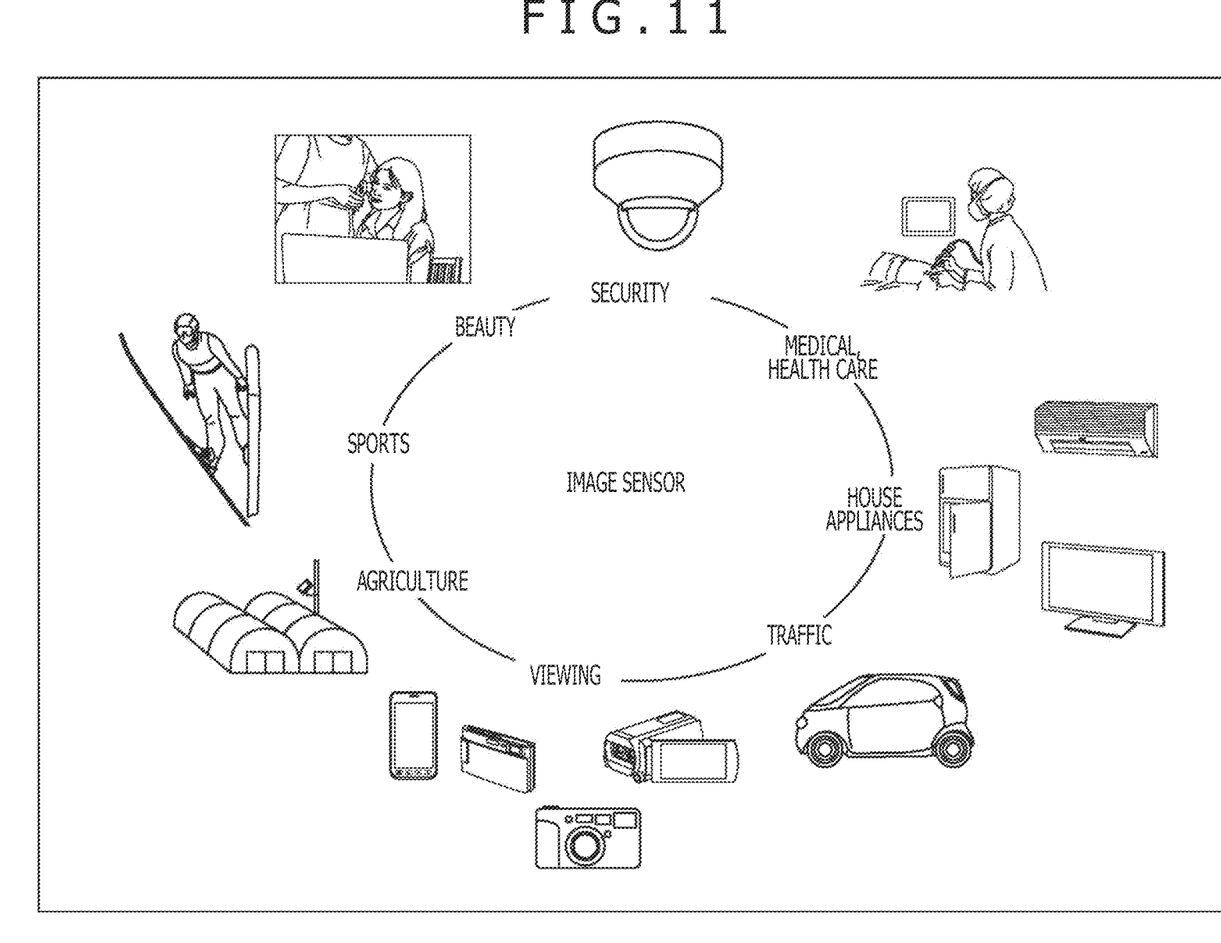
FIG. 11 is a diagram illustrating a use example of a solid-state imaging apparatus.

FIG. 11 depicts a diagram illustrating a usage example of the solid-state imaging apparatus described above.

The solid-state imaging apparatus described above is, for example, usable in various cases where such lights as visible light, infrared light, ultraviolet light, and X ray are sensed as below.

- Apparatuses for taking images subject to appreciation, such as digital cameras, portable devices having camera function, and the like.
- Apparatuses for use in traffic applications such as in-car sensors for taking images of the front, rear, around, inside of a car, monitor cameras for monitoring travelling vehicles and roads, and ranging sensors for ranging the interval between vehicles, for example, in order to secure the safe drive such as automatic stop and the recognition of driver's states.
- Apparatus for use in such household appliances as TVs, refrigerators, and air conditioners in order to take the gestures of a user for operating devices in accordance with the performed gestures.
- Apparatus for use in medical and heath cares such as apparatuses including endoscopes and apparatuses for taking images of blood vessels by infrared light photo sensitivity.

Apparatuses for use in security such as crime preventing monitor cameras and person identification cameras.

Apparatuses for use in beauty cares such as skin analyzers for taking images of skin and microscopes for taking images of scalp.

Apparatuses for use in sports such as action cameras and wearable cameras for sport applications.

Apparatuses for use in agriculture such as cameras for monitoring fields and crops.

{Imaging Apparatus}

Figure 12:
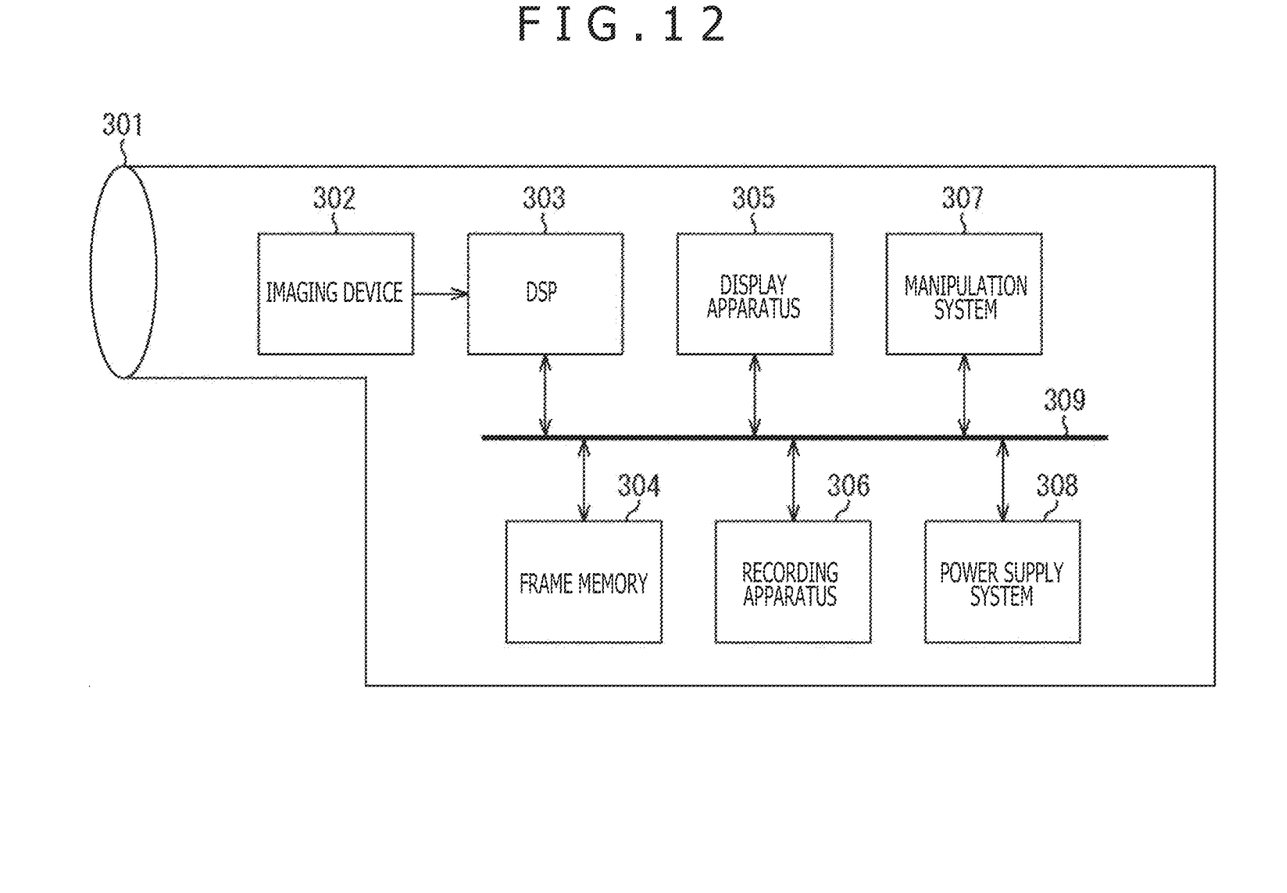
FIG. 12 is a block diagram illustrating an exemplary configuration of an electronic device.

FIG. 12 depicts a block diagram illustrating an exemplary configuration of an imaging apparatus (a camera apparatus) that is one example of an electronic device to which the present technology is applied.

As depicted in FIG. 12, the imaging apparatus has an optical system including a lens group 301, an imaging device 302, a DSP circuit 303 that is a camera signal processing block, a frame memory 304, a display apparatus 305, a recording apparatus 306, a manipulation system 307, and a power supply system 308. The DSP circuit 303, the frame memory 304, the display apparatus 305, the recording apparatus 306, the manipulation system 307, and the power supply system 308 are interconnected via a bus line 309.

The lens group 301 captures an incidence light (an image light) coming from a subject so as to form the captured image onto the imaging surface of the imaging device 302. The imaging device 302 converts the intensity of the incidence light formed on the imaging surface by the lens group 301 into an electrical signal on a pixel basis and outputs this electrical signal as a pixel signal.

The display apparatus 305, including a panel display apparatus such as a liquid crystal display apparatus or an organic EL (Electro Luminescence) display apparatus, displays a moving image or a still image taken by the imaging device 302. The recording apparatus 306 records moving images and still images taken by the imaging device 302 to a recording medium such as a memory card, a video tape, or a DVD (Digital Versatile Disk).

The manipulation system 307 issues manipulation commands about various functions of the present imaging apparatus under the manipulation by a user. The power supply system 308 appropriately supplies various power supplies providing the operating powers for the DSP circuit 303, the frame memory 304, the display apparatus 305, the recording apparatus 306, and the manipulation system 307.

The imaging apparatus as described above is applied to video cameras, digital still cameras, and camera modules for use in mobile devices such as smartphones and mobile telephones. In this imaging apparatus, the solid-state imaging apparatuses related with the respective embodiments described above can be used for the imaging device 302. Consequently, the image quality of the imaging apparatus can be enhanced.

It should be noted that the embodiments of the present technology are not restricted to those described above; namely, changes and variations may be made without departing from the spirit of the present technology.

Further, for example, the present technology can also take the following configuration:

(1) A solid-state imaging apparatus including:
a pixel array block on which pixels each including a photoelectric conversion device are arranged;
a polarizer that includes a conductive light-shielding material and covers a photosensitive surface of the photoelectric conversion device of at least part of the pixels;
a light-shielding film that includes a conductive light-shielding material and arranged between the adjacent pixels on the photosensitive surface side of the photoelectric conversion device; and
a wiring layer arranged on a side opposite to the photosensitive surface of the photoelectric conversion device,
in which the polarizer is connected to a wiring of the wiring layer via the light-shielding film.

(2) The solid-state imaging apparatus according to (1) above, in which
a negative potential is applied to the polarizer via the wiring and the light-shielding film.

(3) The solid-state imaging apparatus according to (1) or (2) above, in which
the light-shielding film and the wiring are interconnected with a through-hole electrode penetrating a semiconductor substrate on which the photoelectric conversion device is formed.

(4) The solid-state imaging apparatus according to (3) above, in which
the through-hole electrode includes a conductive light-shielding material and encloses a side surface of the photoelectric conversion device.

(5) The solid-state imaging apparatus according to (3) above, in which
the through-hole electrode is formed in an area around the pixel array block.

(6) The solid-state imaging apparatus according to any one of (1) through (5) above, in which
the polarizer and the light-shielding film are formed on a same layer.

(7) An electronic device including:
a solid-state imaging apparatus; and
a signal processing block configured to process a signal outputted from the solid-state imaging apparatus,
the solid-state imaging apparatus having
a pixel array block on which pixels each including a photoelectric conversion device are arranged,
a polarizer that includes a conductive light-shielding material and covers a photosensitive surface of the photoelectric conversion device of at least part of the pixels,
a light-shielding film that includes a conductive light-shielding material and is arranged between the adjacent pixels on the photosensitive surface side of the photoelectric conversion device, and
a wiring layer arranged on a side opposite to the photosensitive surface of the photoelectric conversion device,
in which the polarizer is connected to a wiring of the wiring layer via the light-shielding film.

REFERENCE SIGNS LIST 10, 10A, 10B . . . CMOS image sensors, 11 . . . Pixel array block, 12 . . . Vertical drive block, 13 . . . Column processing block, 14 . . . Horizontal drive block, 15 . . . System control block, 16 . . . Pixel drive line, 17 . . . Vertical signal line, 18 . . . Signal processing block, 101 . . . Wiring layer, 102 . . . Semiconductor substrate, 121 . . . Wiring, 122 . . . Photoelectric conversion device, 124 . . . Polarizer, 125 . . . Light-shielding film, 126 . . . Through-hole electrode, 127 . . . Contact, 128 . . . Color filter

What is claimed is:
1. A solid-state imaging apparatus comprising:
a pixel array block on which a plurality of adjacent pixels is arranged, each pixel including a photoelectric conversion device;

a polarizer including a first conductive light-shielding material, wherein the polarizer covers a photosensitive surface of a photoelectric conversion device of a first pixel of the plurality of adjacent pixels;

a light-shielding film including a second conductive light-shielding material, wherein the light-shielding film is arranged between each of the adjacent pixels on the photosensitive surface side of the photoelectric conversion device of the first pixel of the plurality of adjacent pixels; and a wiring layer arranged on a side of the photoelectric conversion device opposite to the photosensitive surface of the photoelectric conversion device of the first pixel of the plurality of adjacent pixels, wherein the light-shielding film is connected to the polarizer and the wiring layer, wherein the polarizer is connected to a wiring of the wiring layer via the light-shielding film, and wherein the polarizer is capable of being applied with a negative potential via the wiring and the light-shielding film.

2. The solid-state imaging apparatus according to claim 1, wherein the negative potential is applied to the polarizer via the wiring and the light-shielding film.

3. The solid-state imaging apparatus according to claim 1, wherein the light-shielding film and the wiring are interconnected with a through-hole electrode penetrating a semiconductor substrate on which the photoelectric conversion device of the first pixel is formed.

4. The solid-state imaging apparatus according to claim 3, wherein the through-hole electrode includes a conductive light-shielding material and encloses a side surface of the photoelectric conversion device of the first pixel.

5. The solid-state imaging apparatus according to claim 3, wherein the through-hole electrode is formed in an area around the pixel array block.

6. The solid-state imaging apparatus according to claim 1, wherein the polarizer and the light-shielding film are formed on a same layer.

7. An electronic device comprising:

a solid-state imaging apparatus; and a signal processing block configured to process a signal outputted from said solid-state imaging apparatus, said solid-state imaging apparatus having a pixel array block on which a plurality of adjacent pixels is arranged, each pixel including a photoelectric conversion device, a polarizer including a first conductive light-shielding material, wherein the polarizer covers a photosensitive surface of a photoelectric conversion device of a first pixel of the plurality of adjacent pixels, a light-shielding film including a second conductive light-shielding material, wherein the light-shielding film is arranged between each of the adjacent pixels on the photosensitive surface side of the photoelectric conversion device of the first pixel of the plurality of adjacent pixels, and a wiring layer arranged on a side of the photoelectric conversion device opposite to the photosensitive surface of the photoelectric conversion device of the first pixel of the plurality of adjacent pixels, wherein the light-shielding film is connected to the polarizer and the wiring layer, wherein the polarizer is connected to a wiring of the wiring layer via the light-shielding film, and wherein the polarizer is capable of being applied with a negative potential via the wiring and the light-shielding film.

* * * * *